United States Patent [19]

Ishikawa et al.

[11] Patent Number: 6,080,709
[45] Date of Patent: Jun. 27, 2000

[54] CLEANING SOLUTION FOR CLEANING SUBSTRATES TO WHICH A METALLIC WIRING HAS BEEN APPLIED

[75] Inventors: Norio Ishikawa; Kiyoto Mori, both of Saitama-ken; Hidemitsu Aoki, Tokyo, all of Japan

[73] Assignees: Kanto Kagaku Kabushiki Kaisha; NEC Corporation, both of Tokyo, Japan

[21] Appl. No.: 09/131,976

[22] Filed: Aug. 11, 1998

[30] Foreign Application Priority Data

Aug. 12, 1997 [JP] Japan ................................... 9-228943

[51] Int. Cl.$^7$ ............................... C11D 3/30; C11D 7/08; C11D 3/33
[52] U.S. Cl. ......................... 510/175; 510/181; 510/197; 510/202; 510/203; 510/206; 510/218; 510/245; 510/247; 510/253; 510/254; 510/255; 510/398; 510/434; 510/477; 510/480; 134/1.2; 134/1.3
[58] Field of Search .................................... 510/175, 181, 510/197, 202, 203, 206, 218, 245, 247, 253, 254, 255, 398, 434, 477, 480; 134/1.2, 1.3

[56] References Cited

U.S. PATENT DOCUMENTS

| | | |
|---|---|---|
| 4,209,418 | 6/1980 | Anderson .............................. 252/148 |
| 4,226,640 | 10/1980 | Bertholdt .................................... 134/3 |
| 4,357,254 | 11/1982 | Kapiloff et al. ........................... 252/181 |
| 4,452,643 | 6/1984 | Martin et al. ............................... 134/3 |
| 4,822,854 | 4/1989 | Ciolino et al. ...................... 252/174.19 |
| 5,108,514 | 4/1992 | Kisner .................................... 134/22.1 |
| 5,154,197 | 10/1992 | Auld et al. ................................. 134/1 |
| 5,759,437 | 6/1998 | Datta et al. ............................. 252/79.1 |

FOREIGN PATENT DOCUMENTS 8-187475 of 1996 Japan .

OTHER PUBLICATIONS

U.S. application No. 08/275,632, Krusell, filed 1994.

*Primary Examiner*—Mark Kopec
*Assistant Examiner*—Charles Boyer
*Attorney, Agent, or Firm*—Darby & Darby

[57] ABSTRACT

The present invention relates to a cleaning solution for cleaning substrates, to which a metallic wiring has been applied, being capable of easily removing the metallic impurities of the substrate surface without corroding the metal, not putting a strain on the environment, and not causing a shelf life problem.

The cleaning solution comprising at least one member selected from a group consisting of oxalic acid, ammonium oxalate and polyaminocarboxylic acids, but contains no hydrogen fluoride.

10 Claims, No Drawings

6,080,709

CLEANING SOLUTION FOR CLEANING SUBSTRATES TO WHICH A METALLIC WIRING HAS BEEN APPLIED

BACKGROUND OF THE INVENTION

The invention relates to a cleaning solution, and particularly to a cleaning solution for removing metallic contaminants of substrates to which a metallic wiring has been applied.

More particularly, the invention relates to a cleaning solution for substrates having metallic wiring used after a chemical mechanical polishing (CMP) process in semiconductor manufacturing.

A trend for higher integration of ICs has brought about the need for strict contamination control, because trace impurities have a considerable effect on the properties and yield of devices. Which means that the concentration of metallic impurities at the substrate surface needs to be limited to or below $10^{10}$ atoms/cm$^2$; for this purpose different types of cleaning solutions are used in the different processes of semiconductor manufacturing.

In general, mixed solutions of sulfuric acid-aqueous hydrogen peroxide, ammonium water-aqueous hydrogen peroxide-water (SC-1), hydrochloric acid-aqueous hydrogen peroxide-water (SC-2), diluted hydrofluoric acid, etc., are used as cleaning solutions for semiconductor substrates, and depending on the purpose, each cleaning solution can be used on its own or in combination with other cleaning solutions. On the other hand, since in recent years CMP technology has been introduced into semiconductor manufacturing processes for the planarization of the insulation film, the planarization of the contact holes, for damascene wiring, etc.; e.g., the monthly publication Semiconductor World, p. 92, 3, 1997, mentions the use of an aqueous solution of citric acid, and WO 96/26538 mentions the use of an aqueous solution of citric acid or of ethylenediamine tetraacetic acid (EDTA), etc., together with hydrogen fluoride, for the purpose of cleaning the metallic impurities adsorbed by the substrate surface after a CMP process. Further, in JP, A, H10-72594 (EP, A, 812011), filed before and laid-open after the priority date of the present application, a cleaning solution containing an organic acid, such as citric acid, etc., and a complexing solution are mentioned.

Since the aqueous solutions, as mentioned above, used in general as a cleaning solution for cleaning a substrate surface, to which a metallic wiring has been applied, are oxidizable and at the same time strongly acidic or strongly alkaline liquids, the metal exposed on said substrate surface is of course corroded (by etching), and even if the metal is covered by an insulating layer, etc., the metal will be corroded when the cleaning solution penetrates the layer; consequently, there are cases when these cleaning solutions cannot be used in semiconductor manufacturing processes. It is, e.g., impossible to utilize such cleaning solutions with applied CMP process such as the layer interconnection technology known as W (tungsten) plug process, which has received much attention recently, etc.

In general, metal CMP is a technology for planarizing a film by polishing the interlayer insulation film and the metallic material by simultaneously using the chemical and physical effects, when a wafer is pressed against a cloth called buff and is rotated while feeding a slurry, a mixture of abrasive particles and chemicals; however, there is a problem that, as a result of the polishing process, a great number of metallic impurities are adsorbed by the surface of the silicon oxide film, etc. Consequently, a cleaning solution for effectively removing such metallic impurities is required.

Especially with W-CMP, a slurry of alumina-iron(III) nitrate is generally used, which has excellent characteristics with regard to polishing speed and processing accuracy; however, the problem arises that a great amount of Fe is adsorbed by the exposed surface of the silicon oxide film after the blanket tungsten film is removed, because iron(III) nitrate is used as oxidizer. And since a high concentration of iron(III) nitrate is used, the Fe surface concentration adsorbed by the surface of the silicon oxide film is, with $10^{14}$ atoms/cm$^2$ or more, extremely high; besides, secondary contamination to the wafer production line also presents a problem. Consequently, it is preferred that the Fe adsorbed by the substrate during the CMP process be removed to a concentration of $10^{10}$ atoms/cm$^2$ before passing to the next process. Even though one may hope to remove the metallic impurities with cleaning solutions containing the hydrogen fluoride according to the before-mentioned prior art, it is impossible to solve the problem of metal corrosion and of the etching of the interlayer insulation film.

On the other hand, when applying a method using an aqueous solution of citric acid according to the before-mentioned prior art as cleaning solution after the W plug CMP process, etc., to solve the problem of metal corrosion, even though the corrosion of the metal can be avoided after the cleaning process with an aqueous solution of citric acid, the Fe concentration of the substrate surface is about $10^{13}$ atoms/cm$^2$, which is not at all sufficient.

Moreover, since a high concentration of 20 to 30% is necessary to obtain an adequate cleaning effect with a cleaning solution using citric acid, the strains on the environment, due to the liquid waste disposal, etc., increase, and shelf life also becomes a problem since the tendency to mold increases.

Thus, a means for solving the above-mentioned problems in a comprehensive manner is not known at present.

Consequently, the object of the present invention is to provide a cleaning solution for cleaning a substrate after metallic wiring has been implemented, capable of removing metallic impurities of a substrate surface with ease and efficiency, without causing metal to corrode, and without creating a problem for the environment or the shelf life.

SUMMARY OF THE INVENTION

As a result of extensive research to achieve the above-mentioned object, the inventors of the present invention have found that a cleaning solution containing at least one member selected from among a group consisting of oxalic acid, ammonium oxalate, polyaminocarboxylic acids, and not containing hydrogen fluoride, is good for cleaning semiconductor substrates, and especially good for cleaning metallic impurities adsorbed by the wafer after a CMP process. I.e., the present invention is a cleaning solution for cleaning a substrate after metallic wiring has been implemented, containing at least one member selected from among a group consisting of oxalic acid, ammonium oxalate, polyaminocarboxylic acids, and not containing hydrogen fluoride. The oxalic acid, ammonium oxalate or polyaminocarboxylic acids according to the present invention can be used for cleaning Fe because they form a complex with Fe and because they have high stability constants, however, by using oxalic acid and/or ammonium oxalate together with polyaminocarboxylic acids a particularly good cleaning efficiency can be obtained. It is thought that the cleaning efficiency is increased because Fe forms a three-dimensional complex, which has improved solubility, with oxalic acid and polyaminocarboxylic acid.

Moreover, the cleaning solution according to the present invention is also efficient for cleaning other metallic impurities, e.g. Mn, Al, Ce, etc., originating from the slurry. The reasons for this are that:

1) Complexes formed between Mn and oxalic acid have high stability constant, and their salt have high solubility in aqueous solutions of oxalic acid,
2) complexes formed between Al and oxalic acid, compared to complexes formed with citric acid, have extremely high stability constants, and
3) Ce forms stable complexes with ethylenediamine tetraacetic acid (EDTA), and its oxalate is easily soluble in aqueous alkali solutions of EDTA.

Thus, the cleaning solution according to the present invention exhibits an adequate effect with respect not only to Fe, but also to the other metallic impurities originating from the slurry.

Moreover, even though the cleaning solution according to the present invention is an acidic liquid, it has the desirable characteristic of not corroding metals like aluminum, aluminum alloys, copper, tungsten, titan, titanium nitride, etc. Consequently, the present invention is effective for cleaning metallic impurities adsorbed by a substrate surface after a CMP process, and after metallic wiring has been implemented on the substrate, irrespective of whether metal is exposed on said surface or not, since there is no danger of said metal being corroded, and is further effective for removing metallic contaminants remaining on a substrate without etching the metallic wiring of a Printed Circuit Board comprising electronic components and the metallic wiring of damascence structure.

Furthermore, compared to cleaning solutions of citric acid, the cleaning solution according to the present invention exhibits sufficient cleaning efficiency at only 1/10 the concentration; also, there is no danger of generating mold, and the strain on the environment is also largely reduced.

The concentration of oxalic acid or ammonium oxalate in the cleaning solution according to the present invention for cleaning a substrate after metallic wiring has been implemented is between 0.1 and 10 wt %, and preferably between 1.0 and 6 wt %.

When the concentration of oxalic acid is too low, the cleaning effect is insufficient, but with a high concentration, an effect corresponding to the concentration cannot be hoped for, and there is also the danger of crystallization.

Further, as polyaminocarboxylic acid compounds of ethylenediamine tetraacetic acid (EDTA), trans-1,2-cyclohexanediamine tetraacetic acid (CyDTA), nitrilotriacetic acid (NTA), diethylenetriamine pentaacetic acid (DTPA), N-(2-hydroxyethyl)ethylenediamine-N,N',N'-triacetic acid (EDTA-OH), etc., and their ammonium salts are preferable. In general, these compounds are used as free acids or in the form of salt; however, free acids are not suitable for adjusting solutions with high concentrations, since they have a low solubility in water or in acid. Consequently, water soluble salts have to be used for adjusting solutions with high concentrations, and most preferable are ammonium salts, not containing metals, that do not have an adverse effect on properties during the semiconductor manufacturing process.

The concentration of polyaminocarboxylic acid is between 0.0001 and 5 wt %, and preferably between 0.001 and 0.1 wt %. When the concentration is low, the cleaning effect is insufficient, but when it is too high, an effect corresponding to the concentration cannot be hoped for. Moreover, the pH of the cleaning solution is between 3 and 5.

In the following, the present invention is explained by Examples in conjunction with a Comparative example, but the present invention is not limited to such Examples.

Comparative Example 1

The Fe concentration of the surface of a silicon wafer with an oxide film, contaminated beforehand by dipping into an aqueous solution of iron(III) nitrate, was measured with a Total Reflection X-ray Fluorescence instrument (Technos Co., Ltd., TREX 610T). Then, 200 g of citric acid were dissolved in 800 g water and used to clean the wafer as a 20 wt % aqueous solution at 40° C. for 3 min, and after rinsing and drying, the Fe concentration at the wafer surface was again measured, and the Fe removal capacity was evaluated (Table 4).

Example 1 (oxalic acid concentration and removal capacity)

Cleaning solutions with 0.1, 1.0, 3.4 wt % respectively were prepared by dissolving oxalic acid in water. After using each cleaning solution, as in Comparative example 1, at 40° C. for 3 min, the Fe removal capacity was evaluated (Table 1).

TABLE 1

|  | oxalic acid concentration | Fe surface concentration ($\times 10^{10}$ atoms/cm$^2$) |
| --- | --- | --- |
| Before cleaning | — | 20,000 |
| After cleaning | 0.1 wt % | 473 |
|  | 1.0 wt % | 23 |
|  | 3.4 wt % | 11 |

Example 2 (treatment temperature and removal capacity)

A 3.4 wt % aqueous solution, prepared by dissolving 34 g oxalic acid in 966 g water, was used as cleaning solution, the treatment temperature was adjusted to 23, 30, 40° C. respectively, and after using the cleaning solution, as in Comparative example 1, for 3 min, the Fe removal capacity was evaluated (Table 2).

TABLE 2

|  | oxalic acid concentration | Fe surface concentration ($\times 10^{10}$ atoms/cm$^2$) |
| --- | --- | --- |
| Before cleaning | — | 20,000 |
| After cleaning | 23° C. | 17 |
|  | 30° C. | 16 |
|  | 40° C. | 11 |

Example 3 (pH and removal capacity)

Cleaning solutions with a pH of 3.0, 4.0, 5.0, 6.5 respectively were prepared by adding ammonia to an aqueous solution of 3.4 wt % oxalic acid. After using each cleaning solution, as in Comparative example 1, at 40° C. for 3 min, the Fe removal capacity was evaluated (Table 3).

TABLE 3

| | pH | Fe surface concentration (× 10 atoms/cm$^2$) |
|---|---|---|
| Before cleaning | — | 20,000 |
| After cleaning | 0.8 | 11 |
| | 3.0 | 17 |
| | 4.0 | 18 |
| | 5.0 | 14 |
| | 6.5 | 25 |

Example 4

A 3.4 wt % aqueous solution of ammonium oxalate was prepared as cleaning solution, and after using this cleaning solution, as in Comparative example 1, at 40° C. for 3 min, the Fe removal capacity was evaluated (Table 4).

Example 5

A mixed solution of oxalic acid and ammonium oxalate, prepared by dissolving 5.0 g oxalic acid and 29 g ammonium oxalate in 966 g water, was used as cleaning solution, as in Comparative example 1, at 40° C. for 3 min, whereafter the Fe removal capacity was evaluated (Table 4).

Example 6

An aqueous solution, prepared by dissolving 34 g oxalic acid and 0.1 g ethylenediamine tetraacetic acid in 965.9 gwater, was used as cleaning solution, as in Comparative example 1, at 40° C. for 3 min, whereafter the Fe removal capacity was evaluated (Table 4).

Example 7

An aqueous solution, prepared by dissolving 34 g oxalic acid and 0.1 g trans-1,2-cyclohexanediamine tetraacetic acid in 965.9 g water, was used as cleaning solution, as in Comparative example 1, at 40° C. for 3 min, whereafter the Fe removal capacity was evaluated (Table 4).

Example 8

An aqueous solution, prepared by dissolving 0.1 g ethylenediamine tetraacetic acid in 999.9 g water, was used as cleaning solution, as in Comparative example 1, at 40° C. for 3 min, whereafter the Fe removal capacity was evaluated (Table 4).

The results of Comparative example 1 and Examples 4 to 8 are shown in Table 4.

TABLE 4

| | Fe surface concentration (× 10$^{10}$ atoms/cm$^2$) |
|---|---|
| Before cleaning | 11996 |
| Comparative example 1 | 2209 |
| Example 4 | 25.1 |
| Example 5 | 10.6 |
| Example 6 | 1.9 |
| Example 7 | 2.3 |
| Example 8 | 6.7 |

Example 9 (etchability in respect to different metals)

Substrates with films of different metals were dipped in a 3.4% aqueous solution of oxalic acid and a 10% aqueous solution of citric acid at 40° C. for 60 min, and after rinsing and spin-drying, the thickness of the metal film was measured with a fluorescence X-ray instrument to determine the amount by which the film thickness had been reduced (Table 5).

TABLE 5

| | Reduction of the film thickness (A) | |
|---|---|---|
| | Tungsten (W) | Titanium nitride (TiN) |
| oxalic acid | 25 | 7 |
| citric acid | 117 | 8 |

What is claimed is:

1. A cleaning solution for cleaning substrates to which a metallic wiring has been applied, consisting essentially of
   (a) 0.1–10 wt % of at least one member selected from the group consisting of oxalic acid and ammonium oxalate; and
   (b) 0.0001–0.1 wt % of at least one member selected from the group consisting of ethylenediamine tetraacetic acid, trans-1,2-cycla exanediamine tetraacetic acid, nitrilotriacetic acid, diethylenetriamine pentaacetic acid, N-(2-hydroxyethyl)ethylenediamine-N,N',N'-triacetic acid, and non-metallic salts thereof,
   wherein neither (a) nor (b) contains hydrogen fluoride, based upon 100% weight of total solution.

2. A cleaning solution according to claim 1 used at room temperature.

3. A cleaning solution according to claim 1, wherein the solution has a pH value of between 3 and 5.

4. A cleaning solution according to claim 1 used after a chemical mechanical polishing of the substrates.

5. A cleaning solution according to claim 4 used for substrates on whose surface the metal is exposed after the chemical mechanical polishing.

6. A cleaning solution according to claim 4 used for substrates on whose surface the metal is not exposed after the chemical mechanical polishing.

7. A cleaning solution according to claim 4 used for metal plugs after the chemical mechanical polishing.

8. A cleaning solution according to claim 1, wherein the solution comprises ethylenediamine tetraacetic acid.

9. A cleaning solution for cleaning substrates to which a metallic wiring has been applied, consisting essentially of
   (a) 0.1–10 wt % of at least one member selected from the group consisting of oxalic acid and ammonium oxalate; and
   (b) 0.0001–0.1 wt % of ethylenediamine tetraacetic acid or non-metallic salt thereof,
   wherein neither (a) nor (b) contains hydrogen fluoride, based upon 100% weight of total solution.

10. A cleaning solution for cleaning substrates to which a metallic wiring has been applied, consisting of
   (a) 0.1–10 wt % of at least one member selected from the group consisting of oxalic acid and ammonium oxalate; and
   (b) 0.0001–0.1 wt % of at least one member selected from the group consisting of ethylenediamine tetraacetic acid, trans-1,2-cyclohexanediamine tetraacetic acid, nitrilotriacetic acid, diethylenetriamine pentaacetic acid, N-(2-hydroxyethyl)ethylenediamine-N,N',N'-triacetic acid, and non-metallic salts thereof, based upon 100% weight of total solution.

* * * * *